United States Patent
Jenq (10) Patent No.: US 6,303,430 B1
(45) Date of Patent: Oct. 16, 2001

(54) METHOD OF MANUFACTURING DRAM CAPACITOR

(75) Inventor: J. S. Jason Jenq, Pingtung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/186,300

(22) Filed: Nov. 4, 1998

(51) Int. Cl.⁷ .................................................. H01L 21/8242
(52) U.S. Cl. ........................... 438/253; 438/255; 438/396; 438/398; 438/254; 438/397
(58) Field of Search .................................. 257/306, 307, 257/308, 309; 438/253, 254, 255, 396, 397, 398

(56) References Cited

U.S. PATENT DOCUMENTS

| | | | | |
|---|---|---|---|---|
| 5,563,090 | * | 10/1996 | Lee et al. ............................... | 438/398 |
| 5,622,888 | * | 4/1997 | Sekine ................................... | 438/398 |
| 5,741,734 | * | 4/1998 | Lee ........................................ | 438/398 |
| 5,817,555 | * | 10/1998 | Cho ....................................... | 438/253 |
| 5,956,587 | * | 9/1999 | Chen et al. ............................ | 438/255 |
| 6,004,857 | * | 12/1999 | Hsiao .................................... | 438/396 |

* cited by examiner

*Primary Examiner*—Carl Whitehead, Jr.
*Assistant Examiner*—Toniae M. Thomas (57) ABSTRACT

A method of manufacturing DRAM capacitor includes forming a tungsten plug to connect with the source/drain region of a silicon substrate and using tungsten to form the upper and lower electrodes of the capacitor. The tungsten lower electrode of this invention is formed by depositing tungsten over the substrate using a physical vapor deposition method, and then depositing tungsten again using a chemical vapor deposition method so that a roughened surface is produced. Consequently, the tungsten lower electrode has a greater surface area, thereby increasing the capacitance of the capacitor. In addition, tantalum pentoxide is used to form the dielectric layer. Since tantalum pentoxide has a high dielectric constant, the effective capacitance of the capacitor is further increased.

29 Claims, 8 Drawing Sheets

METHOD OF MANUFACTURING DRAM CAPACITOR

BACKGROUND OF THE INVENTION

1. Field of Invention

The present invention relates to a method of manufacturing a dynamic random access memory (DRAM) capacitor. More particularly, the present invention relates to a method of manufacturing a DRAM capacitor that has tungsten upper and lower electrodes.

2. Description of Related Art

In this invention, a tungsten plug is used to connect with the source/drain region in a silicon substrate and form the upper and lower electrode of a capacitor. The lower tungsten electrode is formed using a chemical vapor deposition method, and hence the lower electrode has a roughened surface capable of increasing surface area. Furthermore, tantalum pentoxide, which has a relatively high dielectric constant, is used to form the dielectric layer, thus greatly increasing capacitance of the capacitor.

Figure 1:
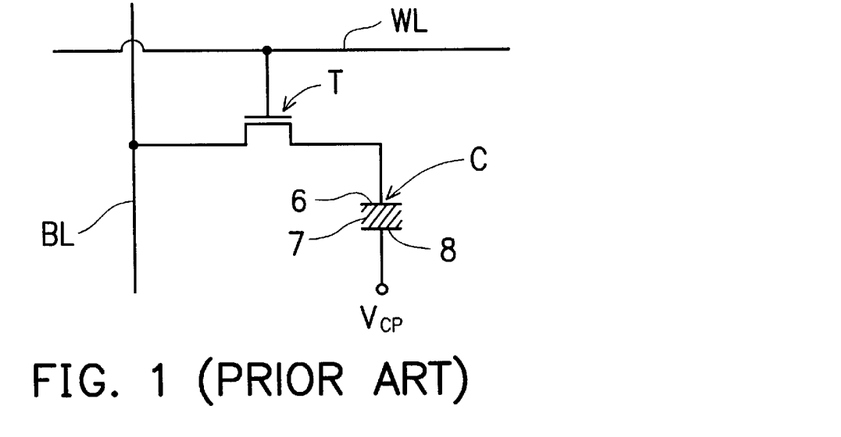
FIG. 1 is a circuit diagram showing one of the memory units of a DRAM device.

DRAM is a widely used integrated circuit component in the electronics industry. FIG. 1 is a circuit diagram showing one of the memory units of a DRAM device. As shown in FIG. 1, a memory unit is composed of a transfer transistor T and a storage capacitor C. The source terminal of the transfer transistor T is connected to a bit line BL, and the drain terminal is connected to the storage electrode 6 of the storage capacitor C. The gate terminal of the transfer transistor T is connected to a word line WL. On the other hand, the opposing electrode 8 of the storage capacitor C is connected to a fixed voltage source. Between the storage electrode 6 and the opposing electrode 8, there is a dielectric layer 7 separating the two. The capacitor C is a place for storing electronic data, and hence the capacitance of the capacitor must be sufficiently large to prevent loss of data.

Figure 2:
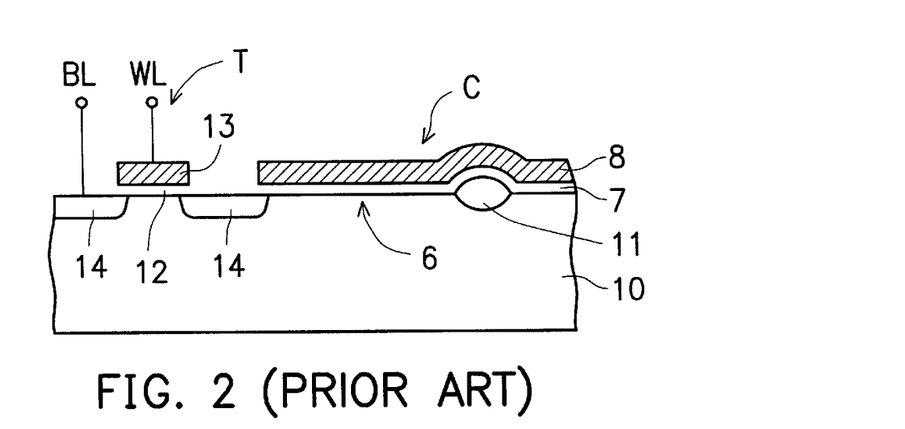
FIG. 2 is a schematic, cross-sectional diagram showing a planar-type capacitor within a memory unit.

For DRAMs having a memory capacity of less than 1 MB, two-dimensional capacitors known also as planar-type capacitors are generally sufficient to store the data. FIG. 2 is a schematic, cross-sectional diagram showing a planar-type capacitor within a memory unit. As shown in FIG. 2, the memory unit is formed by first providing a semiconductor substrate 10, and then forming field oxide layer 11 above the substrate 10. The field oxide layer 11 marks out the active region. Next, gate oxide layer 12, gate layer 13 and source/drain regions 14 are formed in sequence above the substrate 10, thereby creating a transfer transistor T. Thereafter, a dielectric layer 7 and a conductive layer 8 are formed in sequence over the substrate 10 adjacent to the drain terminal. The conductive layer 8, the dielectric layer 7 and a portion of the substrate surface 6 together form a storage capacitor C. As is obvious from FIG. 2, a planar-type capacitor must occupy a large substrate area so that sufficient capacitance can be provided. Hence, this type of capacitor is unsuitable for the production of highly integrated DRAM devices.

In general, for highly integrated DRAM with storage capacity greater than 4 MB, a three-dimensional capacitor structure must be used. Three-dimensional capacitor structures fall into two main categories, namely, the stack-type and the trench-type.

Figure 3:
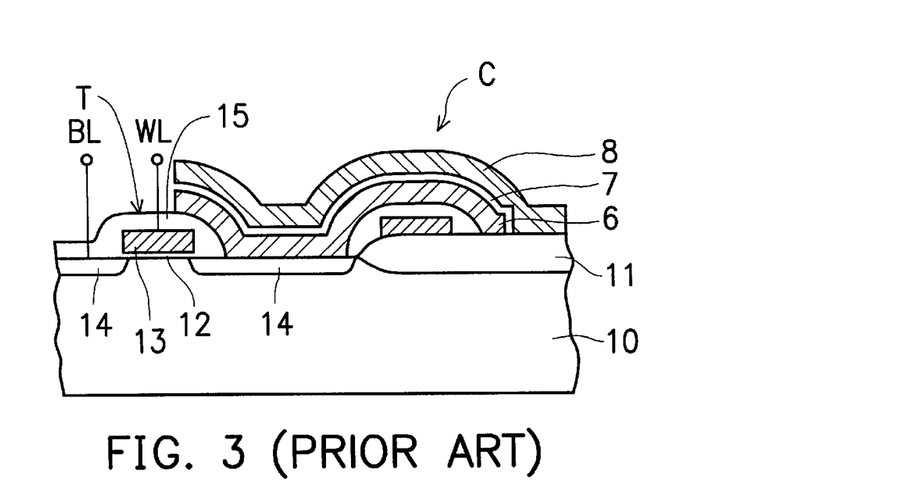
FIG. 3 is a schematic, cross-sectional view of a conventional stack-type capacitor in a memory unit.

FIG. 3 is a schematic, cross-sectional view of a conventional stack-type capacitor in a memory unit. As shown in FIG. 3, the stack-type capacitor is formed by first providing a semiconductor substrate 10. Then, a transfer transistor T is constructed over the substrate 10 by forming field oxide layer 11, gate oxide layer 12, gate layer 13 and source/drain regions 14 in turn. Next, an insulating layer 15 is formed over the substrate structure, and then the insulating layer 15 is etched to form a contact opening above the source/drain region 14.

Thereafter, a second polysilicon layer 6 (serving as a storage electrode), a dielectric layer 7 and a conductive layer 8 (serving as an opposing electrode) are sequentially formed in layers above the contact opening. Hence, a capacitor C having a three-dimensional structure is formed. The capacitor C is capable of providing a sufficiently large amount of capacitance within a small area. However, as the level of integration continues to increase, construction of a DRAM with a capacity of more than 64 MB, for example, using the simple, stack-type of capacitor structure is unable to meet memory demands.

Figure 4:
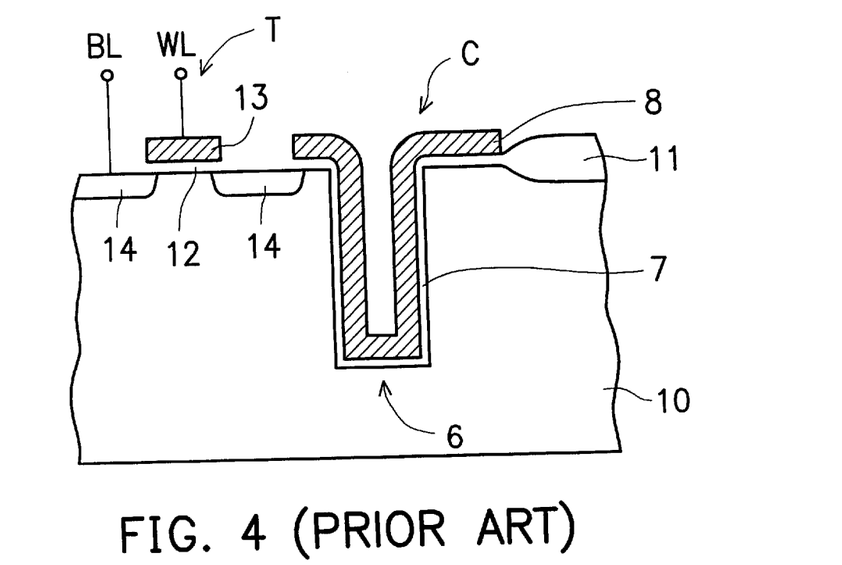
FIG. 4 is a schematic, cross-sectional view of a conventional trench-type capacitor in a memory unit.

FIG. 4 is a schematic, cross-sectional view of a conventional trench-type capacitor in a memory unit. The method of forming a trench-type capacitor includes the steps of first forming a transfer transistor T over a semiconductor substrate 10. The transfer transistor T comprises a gate oxide layer 12, a gate layer 13 and source/drain regions 14. Thereafter, a deep trench is etched out in the substrate 10 in the neighborhood of the drain region 14. In the subsequent step, a storage capacitor C is formed inside the trench. The capacitor C includes a storage electrode 6 made from the substrate material forming the sidewalls and bottom of the trench, a dielectric layer 7 and an opposing electrode 8 made from a layer of polysilicon. Although the trenchtype capacitor is able to increase surface area of the electrode and hence its capacitance, the process of etching the substrate to form a trench may be accompanied by formation of a large number of crystal defects.

Consequently, leakage current within the substrate may be produced. Furthermore, as aspect ratio of the trench continues to increase due to miniaturization, etching rate will correspondingly decrease. Hence, processing operations are more difficult to carry out and production efficiency drops.

Figure 5:
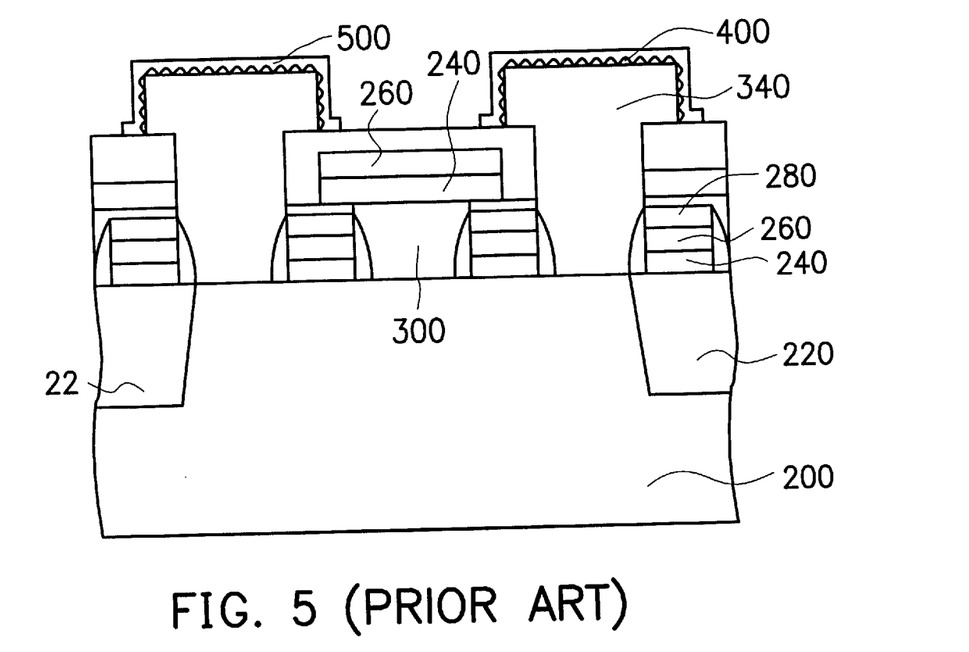
FIG. 5 is a schematic, cross-sectional view of a conventional DRAM capacitor having a polysilicon/HSG/ONO multiple-layered structure.

FIG. 5 is a schematic, cross-sectional view of a conventional DRAM capacitor having a polysilicon/HSG/ONO multiple-layered structure. In FIG. 5, a polysilicon layer 340 and a hemispherical silicon grain (HSG) layer 400 are formed to act as the lower electrode so that surface area is increased. Moreover, an oxide/nitride/oxide (ONO) triple-layered structure 500 is formed to serve as the dielectric layer of the capacitor. However, when the design rules for forming 0.25 $\mu$m devices are applied, the capacitor is still incapable of reaching a capacitance of 25 fF.

Therefore, problems facing conventional DRAM capacitors include:

1. A planar-type of capacitor has to occupy a large surface area in order to provide sufficient capacitance. Hence, it is unsuitable for forming highly integrated DRAM devices.

2. For DRAM having a capacity greater than 4 MB, three-dimensional-type of capacitor such as the stack-type or the trench-type of capacitor must be used. However, as memory capacity continues to increase to about 64 MB or more, even the stack-type of capacitor is unable to provide sufficient capacitance.

3. Although the conventional, trench-type capacitor is able to increase surface area and increase capacitance, the process of etching the substrate to form a trench will generate greater number of crystal defects that can produce leakage current. Furthermore, as device continues to miniaturize, etching will be more difficult and the etching rate will be slower. Therefore, productivity will drop.

4. Although capacitance can increase somewhat if polysilicon, HSG and ONO triple-layered dielectric layer are added to a conventional capacitor, the design rules for a device with dimensions smaller than 0.25 μm makes a capacitance of 25 fF difficult to attain.

In light of the foregoing, there is a need to provide an improved method of forming DRAM capacitor.

SUMMARY OF THE INVENTION

Accordingly, the present invention provides a method of manufacturing a DRAM capacitor that can offer a breakthrough on the 25 fF limit imposed by design rules for fabricating devices with dimension smaller than 0.25 μm.

To achieve these and other advantages and in accordance with the purpose of the invention, as embodied and broadly described herein, the invention provides a method of manufacturing a DRAM capacitor. The method includes using a tungsten plug to connect with the source/drain region in a silicon substrate and tungsten to form the upper and lower electrodes of the capacitor. Furthermore, tantalum pentoxide is used to form the dielectric layer of the capacitor.

According to one preferred embodiment of this invention, the method of forming a DRAM capacitor includes using tungsten to form the upper and lower electrodes of the capacitor. In addition, tantalum pentoxide is used to form the dielectric layer of the capacitor instead of the conventional polysilicon/HSG/ONO multiple-layered structure so that resistance is reduced and leakage current is avoided. The lower electrode of the capacitor is formed by depositing tungsten by physical vapor deposition, and then another tungsten layer having a roughened surface is formed using chemical vapor deposition. Consequently, surface area of the electrode is increased, and hence the capacitance of the capacitor is increased, too. Moreover, choosing tantalum pentoxide as a material for forming the dielectric layer can increase the capacitance of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 6A through 6L are schematic, cross-sectional views showing the progression of manufacturing steps taken to produces a DRAM capacitor according to one preferred embodiment of this invention.

Figure 6A:
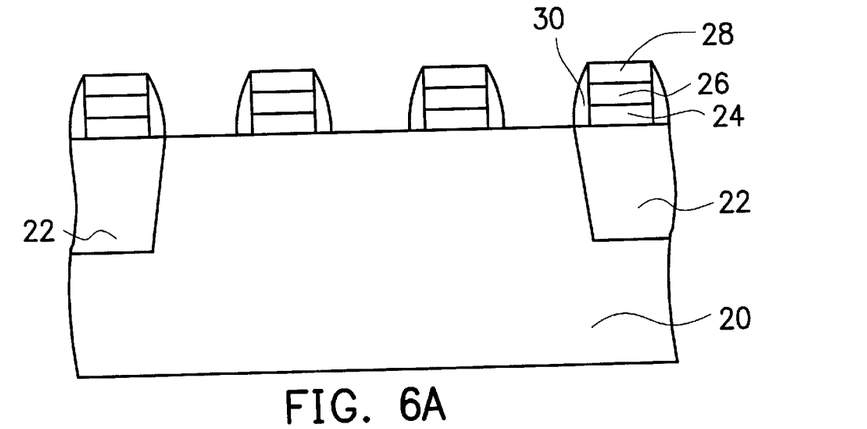
FIGS. 6A through 6L are schematic, cross-sectional views showing the progression of manufacturing steps taken to produce a DRAM capacitor according to one preferred embodiment of this invention.

First, as shown in FIG. 6A, device isolation structures are formed over a semiconductor substrate 20. For example, a shallow trench isolation method is used to pattern out the locations of shallow trenches, and then conventional chemical vapor deposition (CVD) is used to deposit silicon dioxide into the shallow trenches, thereby forming field oxide layers 22. Next, a first conductive layer is formed over the silicon substrate 20 and the field oxide layer 22. The first conductive layer can be formed by first depositing polysilicon over the substrate 20 to form a doped polysilicon layer 24 having a thickness of about 1000 Å.

Then, tungsten is deposited over the polysilicon layer 24 so that tungsten can react with silicon to form a tungsten silicide layer 26 having a thickness of about 1000 Å over the polysilicon layer 24. Lastly, a silicon nitride layer 28 having a thickness of about 1500 Å that acts as a protective layer is formed on top of the tungsten silicide layer 26. In the subsequent step, a photoresist layer (not shown in the figure) is coated over the silicon nitride layer 28, and then a conventional photolithographic process is used to pattern out the gate and connecting lines of the transistor.

A conventional etching technique is used to etch the areas not covered by the photoresist. The exposed regions are etched until a portion of the substrate 20 is exposed. Thereafter, silicon nitride is deposited over the entire substrate, and then an anisotropic etching operation is carried out to form spacers 30 on the sidewalls of the transistor gate.

Figure 6B:
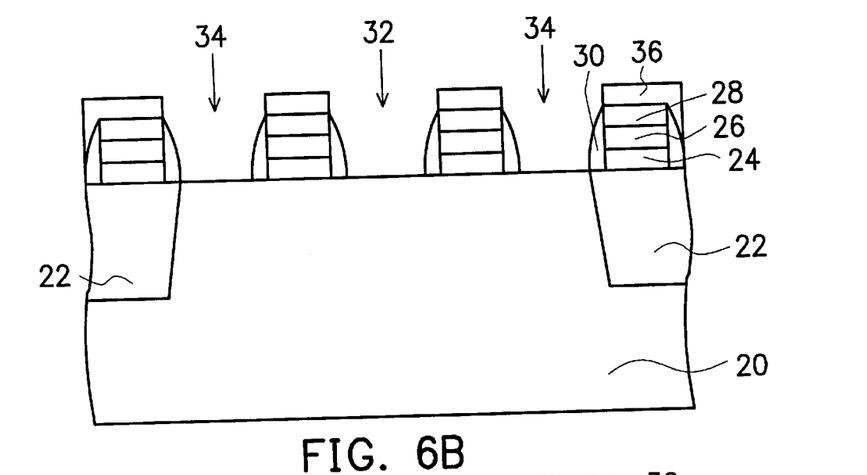

As shown in FIG. 6B, a first insulating layer 36 is formed over the substrate 20. The first insulating layer 36 can be a two-layered structure formed, for example, by first depositing a silicon dioxide layer to a thickness of about 2000 Å using atmospheric pressure chemical vapor, and then depositing borophosphosilicate glass (BPSG) to a thickness of about 7500 Å using atmospheric pressure chemical vapor deposition. Subsequently, the substrate structure is heated to about 800° C. so that the BPSG layer can reflow, and then a chemical-mechanical polishing (CMP) or an etching back method is used to planarize the first insulating layer 36. Thereafter, the first insulating layer 36 is etched to form contact openings 32 and 34 that expose the source terminal and the drain terminal. Since the gate of the transistor is protected by the silicon nitride layer 28 on top and the spacers 30 on both sides, a dry etching operation can be used to form self-aligned contact (SAC) openings 32 and 34.

Figure 6C:
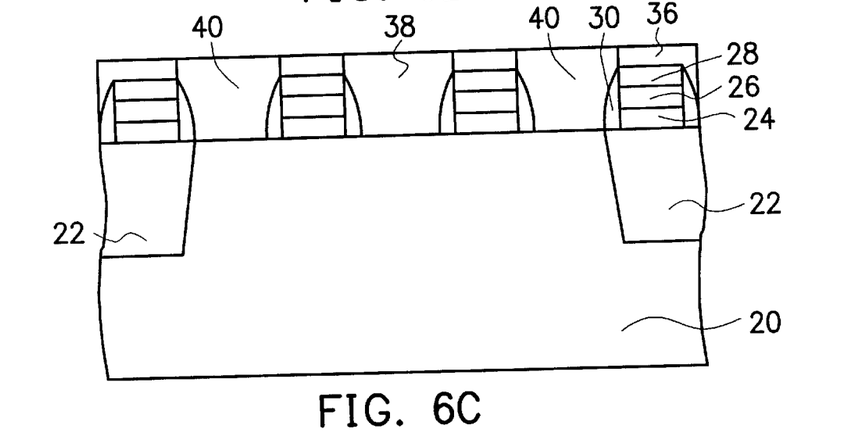

As shown in FIG. 6C, tungsten is deposited into the contact openings 32 and 34 so that a multiple of the exposed source/drain regions is connected. The tungsten layer preferably has a thickness of about 2000 Å. This includes contact opening 32 to bit line and contact opening 34 to contact node. Consequently, a plurality of tungsten plugs 38 and 40 is formed. Tungsten plugs 38 and 40 act as metallic interconnects. Thereafter, the top portion of the tungsten layer is removed using a CMP or an etching back operation so that the tungsten layer is level with the first insulating layer 36. Here, the tungsten plugs 38 and 40 replace the conventional doped polysilicon interconnects. The advantages of using tungsten plugs include a lower electrical resistance and hence a higher operating speed for the transistor.

Figure 6D:
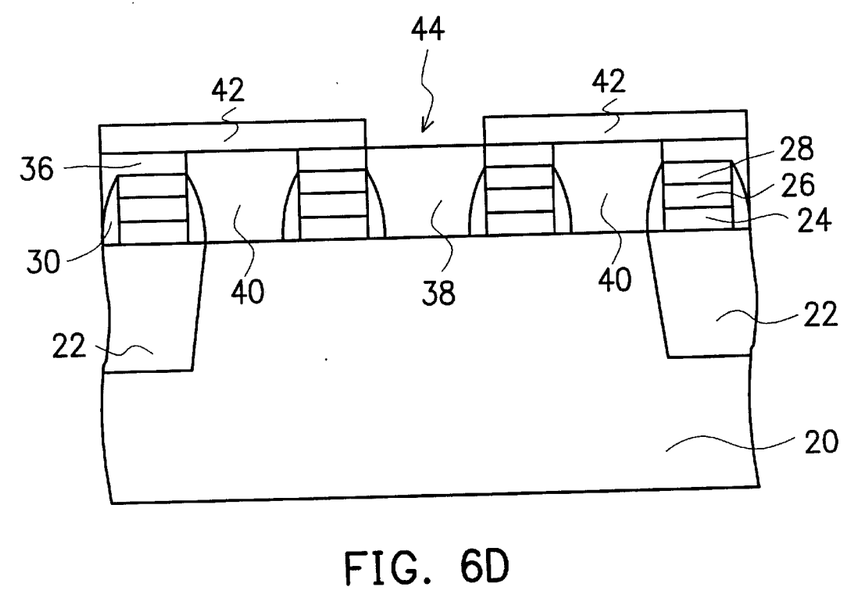

As shown in FIG. 6D, a second insulating layer 42 is deposited over the substrate structure. For example, an atmospheric pressure CVD method can be used to deposit a silicon dioxide layer having a thickness of about 2000 Å. Then, conventional photolithographic and etching processes are used to pattern out a second contact opening 44 that corresponds in position to the tungsten plug 38. The step of forming the second contact opening 44 includes using a dry etching method to form self-aligned contact openings.

Figure 6E:
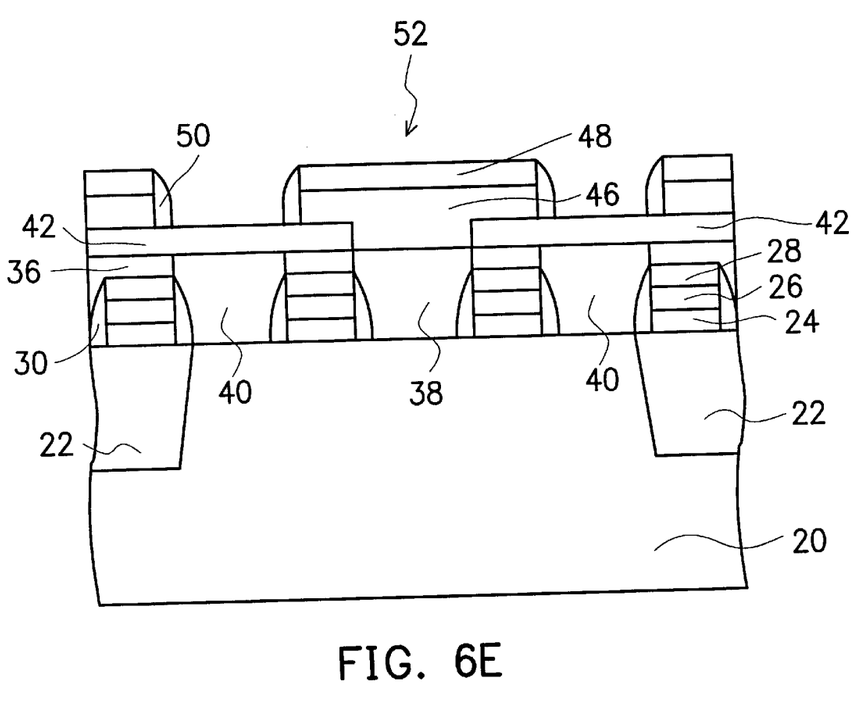

As shown in FIG. 6E, a second conductive layer is formed over the second insulating layer 42 and the second contact opening 44 (FIG. 6D) by, for example low pressure chemical vapor deposition. The second conductive layer is formed, for example, by depositing a tungsten layer 46 having a thickness of about 2000Å over the insulating layer 42 and filling the contact opening 44. Then, a silicon nitride layer 48 having a thickness of about 1500 Å is deposited over the tungsten layer 46 by, for example, plasma-enhanced chemical vapor deposition. The silicon nitride layer 48 serves as a protective layer for the tungsten layer 46. Thereafter, conventional photolithographic and etching processes are used to etch the exposed areas, areas not covered by a photoresist layer (not drawn in the figure), until the second insulating layer 42 is exposed, thereby patterning out the bit line 52. Subsequently, silicon nitride is deposited over the substrate structure, and then an anisotropic etching operation is conducted to form spacers 50 on the sidewalls of the bit line 52.

Figure 6F:
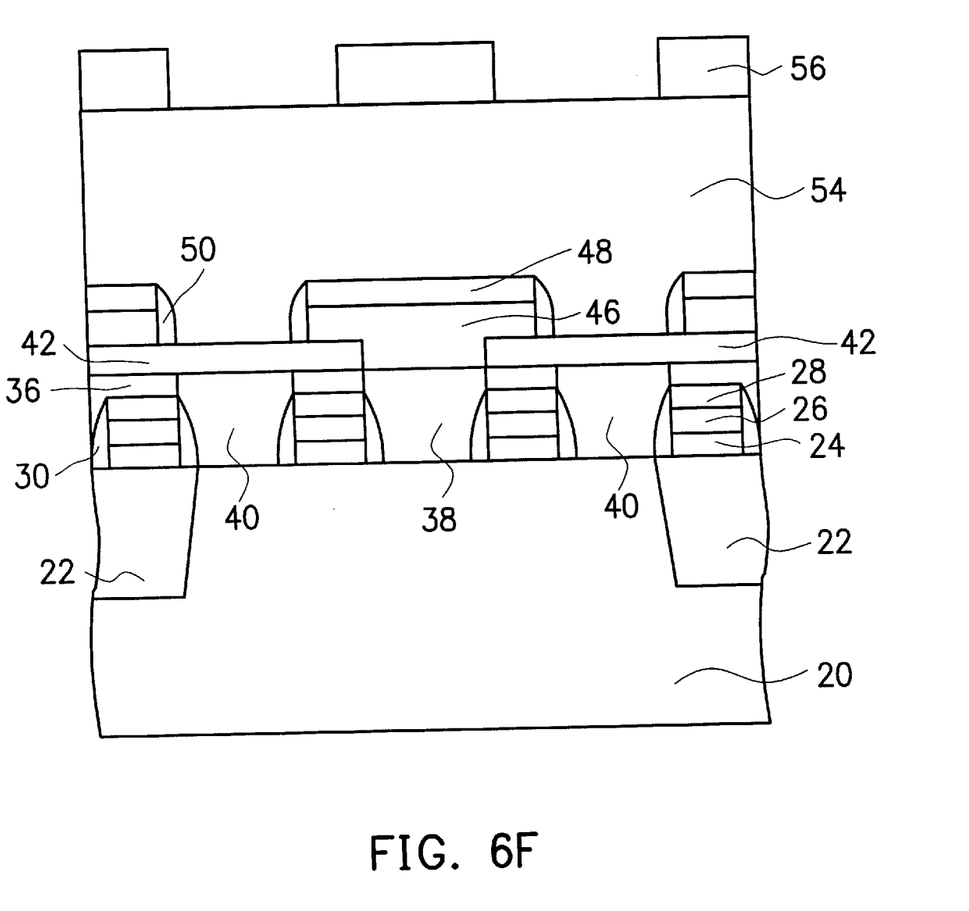

As shown in FIG. 6F, a third insulating layer 54 is formed over the substrate structure. The third insulating layer 54 is formed, for example, by depositing silicon dioxide to a thickness of about 2000 Å or about 1500 Å using an atmospheric CVD method, and then a high-density plasma (HDP) method to deposit a layer of silicon oxide or other oxide material having a thickness of about 16000$\mu$. The two deposited layers together constitute the third insulating layer 54. Subsequently, a patterned photoresist layer 56 is formed over the third insulating layer 54.

Figure 6G:
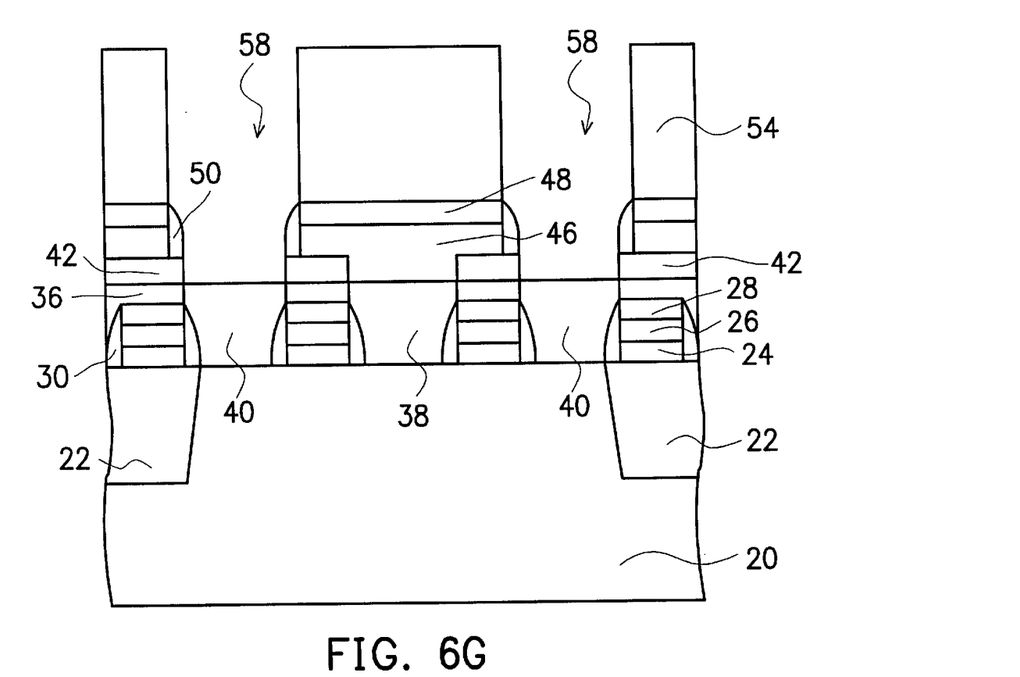

As shown in FIG. 6G, the third insulating layer 54 and then the second insulating layer 42 are etched using the photoresist layer 56 (FIG. 6F) as a mask, thereby forming a fourth contact opening 58 that exposes the tungsten plug 40. The third insulating layer 54 can be etched by, for example, a dry etching method to form a self-aligned contact opening. Thereafter, the photoresist layer 56 is removed. According the embodiment of this invention, since the bit line 52 (FIG. 6E) is protected by the silicon nitride layer 48 and the spacers 50, etching can be carried out using a self-aligned contact (SAC) opening forming method. Therefore, problems caused by alignment errors can be prevented in the etching operation.

Figure 6H:
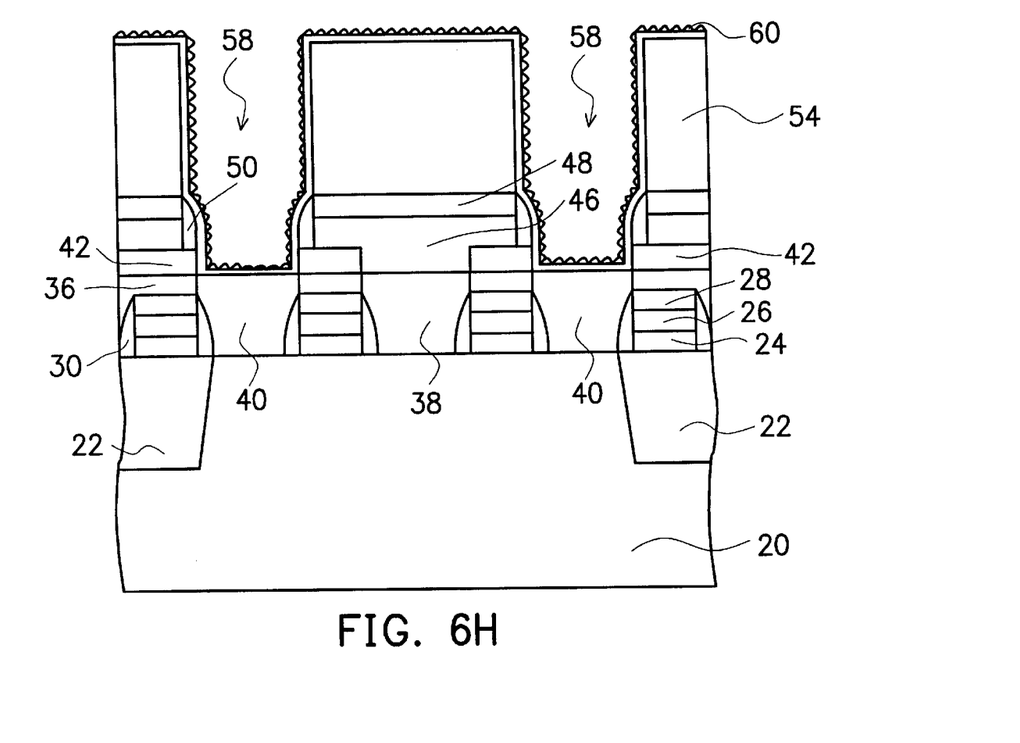

As shown in FIG. 6H, a layer of tungsten having a thickness of about 300$\mu$ is deposited over the entire substrate structure using, for example, a physical vapor deposition (PVD) method. Thereafter, another layer of tungsten having a thickness of about 500$\mu$ is deposited over the previous tungsten layer using a chemical vapor deposition (CVD) method. The two tungsten layers together constitute the lower electrode 60. The second tungsten layer deposited by the CVD method has a roughened surface, therefore able to increase its surface area and hence the capacitance of the capacitor.

Figure 6I:
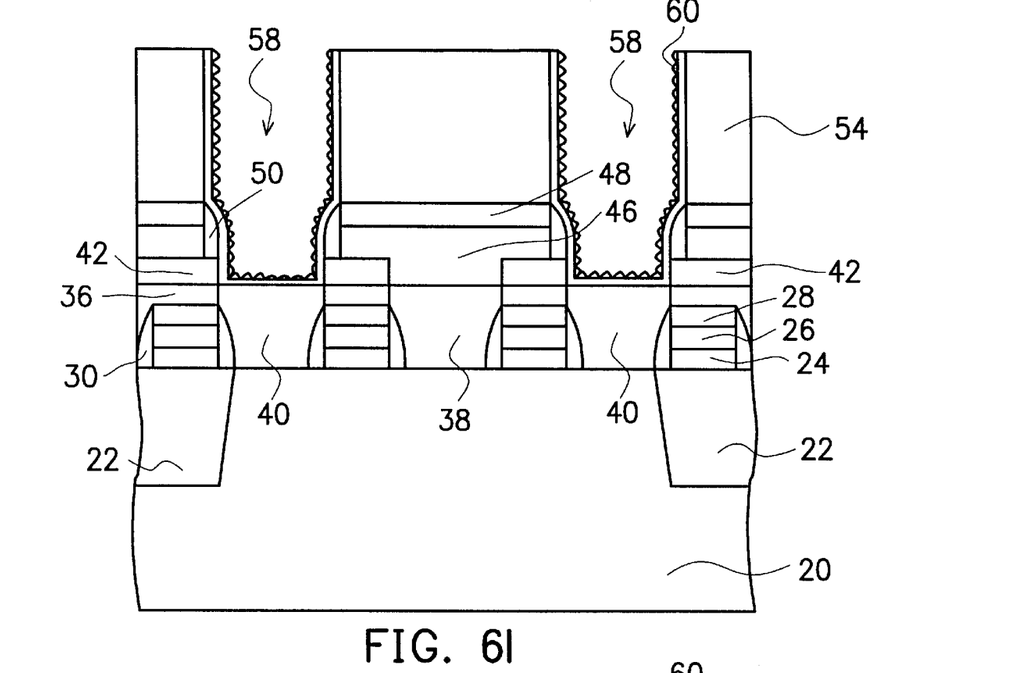

As shown in FIG. 6I, a CMP method is used to remove the tungsten layer 60 on the top surface of the third insulating layer 54 until the third insulating layer 54 itself is exposed. Alternatively, the tungsten layer 60 on the top surface of the third insulating layer 54 is removed by an etching back operation.

Figure 6J:
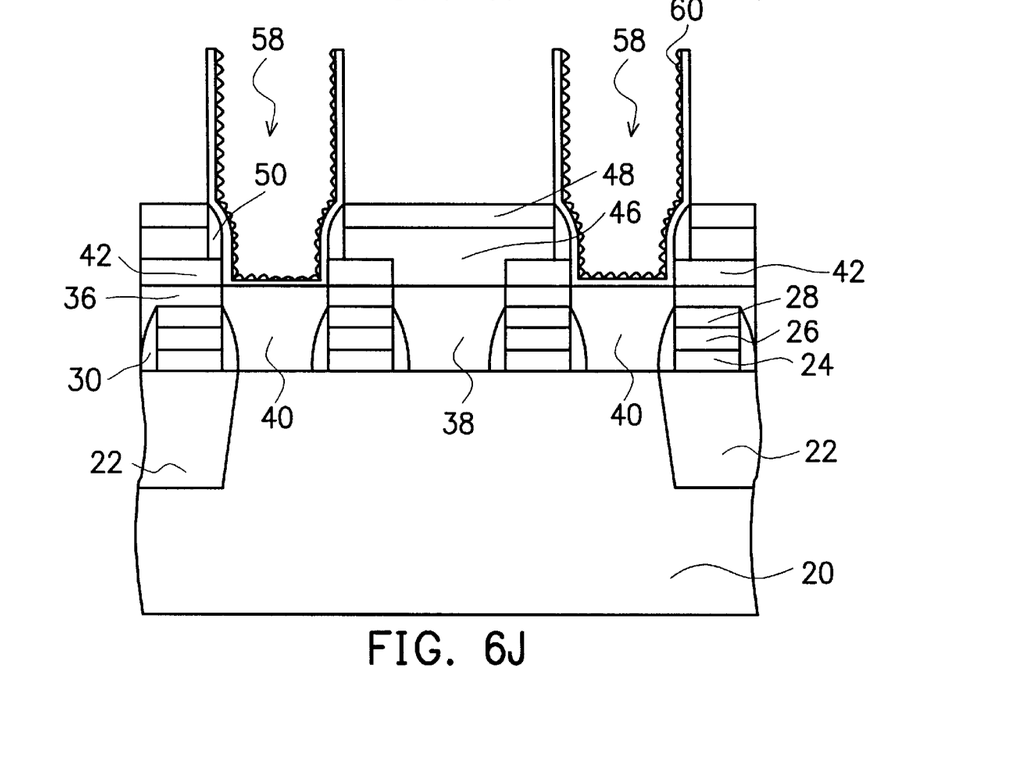

As shown in FIG. 6J, the third insulating layer 54 is removed by etching using a buffered oxide etchant (BOE 20:1) for about 400 to 600 seconds.

Figure 6K:
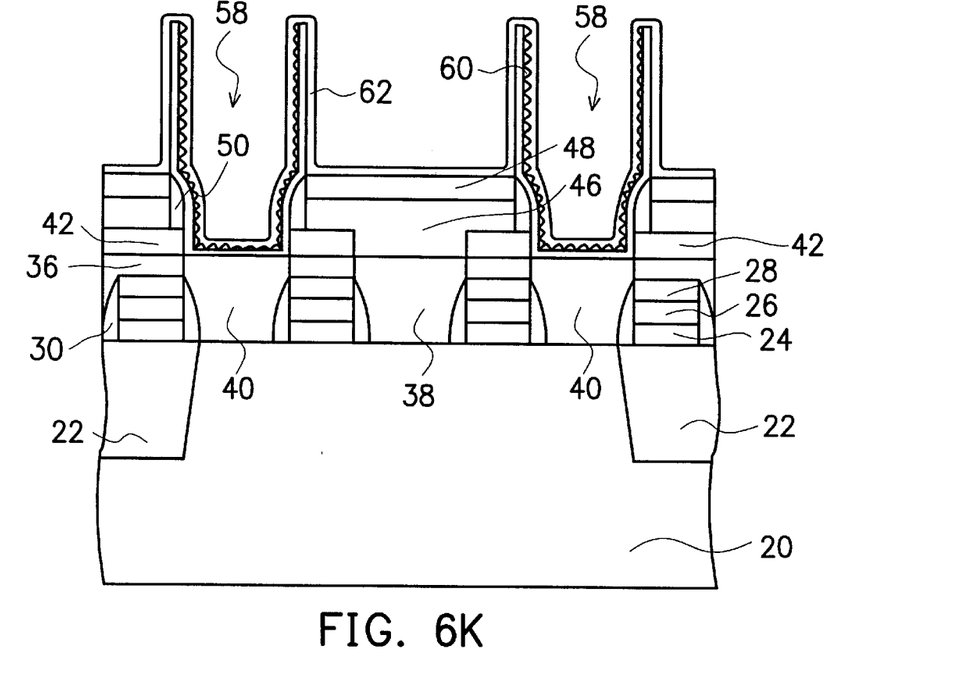

As shown in FIG. 6K, a rapid thermal processing (RTP) is carried out at about 850° C. in an ammonia atmosphere for about 120 seconds. Subsequently, a tantalum pentoxide layer 62 having a thickness of about 80A is deposited over the substrate structure by, for example, chemical vapor deposition. The tantalum pentoxide layer 62 acts as a dielectric layer. Since tantalum pentoxide has a high dielectric constant, using it as a dielectric layer can increase the effective capacitance of a capacitor considerably.

Figure 6L:
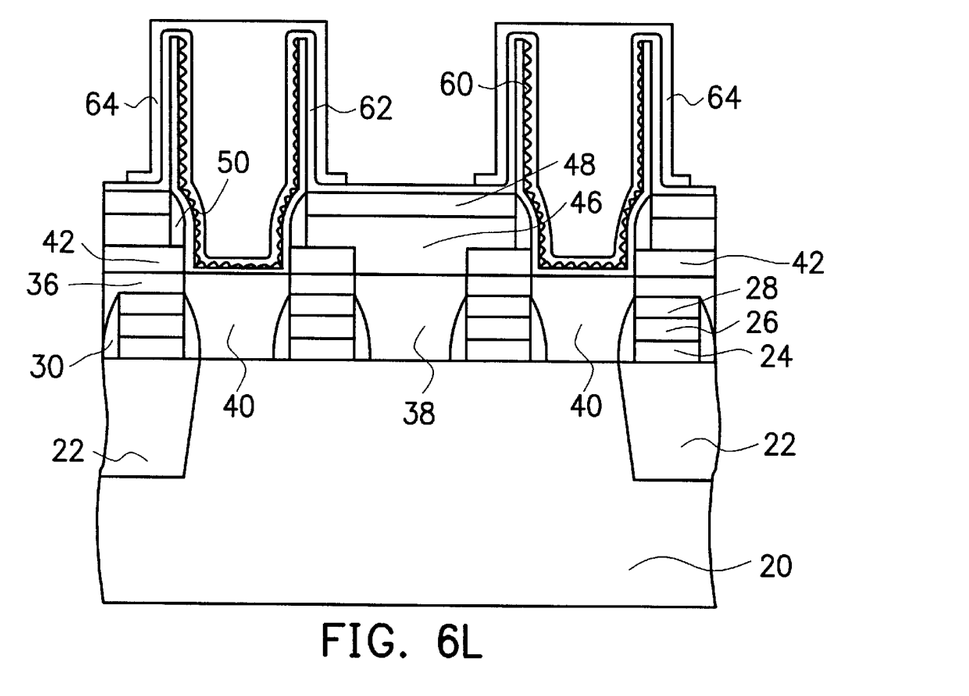

As shown in FIG. 6L, a RTP operation is carried out at about 850° C. in an oxygen atmosphere for about 60 seconds. Thereafter, a layer of tungsten having a thickness of about 500 Å is deposited over the substrate structure using, for example, a PVD method. The tungsten layer acts as an upper electrode 64. In the subsequent step, conventional photolithographic and etching methods are used to pattern out the structure as shown in FIG. 6L. Finally, other operations necessary for building the capacitor is carried out. Since these operations are not directly related to this invention, detailed descriptions are omitted here.

In summary, the major characteristics of this invention include the following:

1. The DRAM capacitor in this invention utilizes a tungsten plug to connect with the source/drain region in a silicon substrate, and employs tantalum pentoxide to form the dielectric layer instead of the conventional polysilicon/HSG/ONO multi-layered structure.

2. A tungsten plug instead of doped polysilicon is used to form interconnects. Hence, internal resistance of interconnects is greatly lowered, and operating speed of devices is increased.

3. Tungsten layers deposited by CVD and PVD methods are used as the lower electrode of a capacitor. Since tungsten deposited by a CVD method has a roughened surface, surface area is increased. Moreover, tantalum pentoxide has very high dielectric constant, and therefore the dielectric layer formed with the material is able to increase effective capacitance of a capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a DRAM capacitor, comprising the steps of:
   providing a semiconductor substrate;
   forming at least one transistor over the substrate, wherein the transistor includes a gate, and source/drain regions on each side of the gate;
   forming a first insulating layer over the substrate;
   forming a plurality of first contact openings and bit line contact openings in the first insulating layer that expose the source/drain regions of the transistor;
   forming a plurality of first contact plugs inside the first contact openings and the bit line contact openings;
   forming a second insulating layer above the first insulating layer and the first contact plugs;
   patterning the second insulating layer to form second contact openings above the first contact plugs inside the bit line contact openings;

forming a conductive layer over the second insulating layer, and inside the second contact openings;

forming a silicon nitride layer over the conductive layer;

patterning the silicon nitride layer and the conductive layer to form a bit line;

forming spacers on the sidewalls of the silicon nitride layer and the conductive layer;

forming a third insulating layer that covers the semiconductor substrate;

patterning the third insulating layer to expose the first contact plugs inside the first contact openings;

forming a first tungsten layer over the third insulating layer and the first contact plugs inside the first contact openings;

forming a second tungsten layer over the first tungsten layer, wherein the first tungsten layer and the second tungsten layer together form a lower electrode that connects with the first contact plugs inside the first contact openings, and the second tungsten layer has a roughened surface;

removing the second tungsten layer and the first tungsten layer above the third insulating layer;

removing the third insulating layer;

forming a tantalum pentoxide dielectric layer over the lower electrode; and forming a third tungsten layer over the tantalum pentoxide dielectric layer, wherein the third tungsten layer acts as an upper electrode.

2. The method of claim 1, wherein the transistor gate further includes a silicon initride layer on top and silicon nitride spacers on its sides.

3. The method of claim 1, wherein the step of forming the first contact openings and the bit line contact openings includes using a dry etching method to form self-aligned contact openings.

4. The method of claim 1, wherein the step of forming the second contact openings includes using a dry etching method to form self-aligned contact openings.

5. The method of claim 1, wherein the step of forming the conductive layer includes depositing tungsten.

6. The method of claim 1, wherein the step of forming the conductive layer includes using low pressure chemical vapor deposition.

7. The method of claim 1, wherein the step of forming the silicon nitride layer includes using a plasma-enhanced chemical vapor deposition.

8. The method of claim 1, wherein material for forming the spacers includes silicon nitride.

9. The method of claim 1, wherein the step of patterning the third insulating layer includes using a dry etching method to form a self-aligned contact opening.

10. The method of claim 1, wherein the step of forming the first tungsten layer includes using physical vapor deposition to deposit a layer of tungsten having a thickness of about 300 Å.

11. The method of claim 1, wherein the step of forming the second tungsten layer includes using chemical vapor deposition to deposit a layer of tungsten having a thickness of about 500 Å.

12. The method of claim 1, wherein the step of forming the tantalum pentoxide dielectric layer includes using chemical vapor deposition to deposit a layer of tantalum pentoxide having a thickness of about 80 Å.

13. The method of claim 1, wherein the step of forming the third tungsten layer includes using physical vapor deposition to deposit a layer of tungsten having a thickness of about 500 Å.

14. The method of claim 1, wherein the step of forming the first contact plugs includes depositing tungsten into the first contact openings.

15. The method of claim 1, wherein the step of removing the first and second tungsten layers above the third insulating layer includes chemical-mechanical polishing.

16. The method of claim 1, wherein the step of removing the first and second tungsten layers above the third insulating layer includes using an etching back operation.

17. The method of claim 1, wherein the step of removing the third insulating layer includes wet etching.

18. The method of claim 1, wherein the step of forming the first insulating layer includes the substeps of:

forming a silicon oxide layer over the substrate; and forming a borophosphosilicate glass layer over the silicon oxide layer.

19. The method of claim 18, wherein the step of forming the silicon oxide layer includes using atmospheric pressure chemical vapor deposition to deposit a layer of silicon oxide having a thickness of about 2000 Å.

20. The method of claim 18, wherein the step of forming the borophosphosilicate glass layer includes using atmospheric pressure chemical vapor deposition to deposit a layer of borophosphosilicate glass having a thickness of about 7500 Å.

21. The method of claim 1, wherein the step of forming the first contact plugs includes the substeps of:

forming a fourth tungsten layer over the first insulating layer, the first contact openings and the bit line contact openings; and removing the fourth tungsten layer over the first insulating layer.

22. The method of claim 21, wherein the fourth tungsten layer has a thickness of about 2000 Å.

23. The method of claim 21, wherein the step of removing a portion of the fourth tungsten layer includes chemical-mechanical polishing.

24. The method of claim 21, wherein the step of removing a portion of the fourth tungsten layer includes using an etching back operation.

25. The method of claim 1, wherein the step of forming the second insulating layer includes forming a silicon oxide layer over the first insulating layer and the first contact plugs.

26. The method of claim 25, wherein the step of forming the silicon oxide layer includes atmospheric pressure chemical vapor deposition to deposit a layer of silicon oxide having a thickness of about 2000 Å.

27. The method of claim 1, wherein the step of forming the third insulating layer includes the substeps of:

forming a first silicon oxide layer over the substrate; and forming a second silicon oxide layer over the first oxide layer.

28. The method of claim 27, wherein the step of forming the first silicon oxide layer includes atmospheric pressure chemical vapor deposition to deposit a layer of silicon oxide having a thickness of about 1500 Å.

29. The method of claim 27, wherein the step of forming the second silicon oxide layer includes using a high-density plasma deposition method to deposit a layer of silicon oxide having a thickness of about 16000 Å.

* * * * *